(12) United States Patent
Shim

(10) Patent No.: US 7,732,805 B2
(45) Date of Patent: Jun. 8, 2010

(54) IMAGE SENSOR AND METHOD FOR MANUFACTURING THE SAME

(75) Inventor: Cheon Man Shim, Yeongdeungpo-gu (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 12/119,838

(22) Filed: May 13, 2008

(65) Prior Publication Data
US 2008/0283883 A1    Nov. 20, 2008

(30) Foreign Application Priority Data
May 16, 2007    (KR)    ...................... 10-2007-0047589

(51) Int. Cl.
H01L 29/06    (2006.01)
(52) U.S. Cl. .................... 257/14; 257/E51.04
(58) Field of Classification Search ................... 257/40, 257/30, 288, E21.422, E21.209, E21.69, 257/14, 292, 72, 751, E51.04; 359/245, 820; 348/240.99; 435/7.9; 365/185.01
See application file for complete search history.

(56) References Cited

U.S. PATENT DOCUMENTS

| | | | |
|---|---|---|---|
| 5,300,374 A * | 4/1994 | Agrawal et al. ............. | 429/312 |
| 6,841,411 B1 | 1/2005 | Varghese | |
| 2003/0025084 A1 | 2/2003 | Honda et al. | |
| 2003/0143453 A1 * | 7/2003 | Ren et al. ...................... | 429/40 |
| 2005/0217722 A1 * | 10/2005 | Komatsu et al. ............. | 136/263 |
| 2005/0244811 A1 * | 11/2005 | Soundarrajan et al. ......... | 435/4 |
| 2006/0067870 A1 * | 3/2006 | Park et al. ................. | 423/447.2 |
| 2007/0148963 A1 * | 6/2007 | Chan et al. .................. | 438/637 |
| 2008/0042230 A1 * | 2/2008 | Miida .......................... | 257/458 |

FOREIGN PATENT DOCUMENTS

CN    1828894 A    6/2006
KR    10-2004-0095502 A    11/2004

OTHER PUBLICATIONS

Bhattacharyya, S., et al. "Photovoltaic Properties of Dye Functionalized Single-Wall Carbon Nanotube/Conjugated Polymer Devices," Chem. Mater. 2004, 16, 4819-4823.

* cited by examiner

Primary Examiner—Thomas L Dickey
Assistant Examiner—Nikolay Yushin
(74) Attorney, Agent, or Firm—Saliwanchik, Lloyd & Saliwanchik

(57) ABSTRACT

An image sensor and a method for manufacturing the same are provided. The image sensor can include transistor circuitry on a substrate, and a photodiode arranged above the transistor circuitry. The photodiode can include carbon nanotubes and a conductive polymer layer on the carbon nanotubes. A transparent conducting electrode can be provided on the carbon nanotubes.

13 Claims, 6 Drawing Sheets

IMAGE SENSOR AND METHOD FOR MANUFACTURING THE SAME

CROSS-REFERENCE TO RELATED APPLICATION

The present application claims the benefit under 35 U.S.C. §119 of Korean Patent Application No. 10-2007-0047589, filed May 16, 2007, which is hereby incorporated by reference in its entirety.

BACKGROUND

A typical CMOS image sensor includes a photodiode area for receiving an optical signal to convert the optical signal into an electrical signal, and a transistor area for processing the electrical signal.

According to the related art, the photodiodes and transistors are horizontally disposed in the CMOS image sensor.

In other words, in the CMOS image sensor according to the related art, the photodiodes and the transistors are positioned on a substrate such that they are horizontally adjacent to each other. Accordingly, additional areas are required for the photodiodes. For this reason, a fill factor area may be reduced, and resolution may be restricted.

Furthers the CMOS image sensor according to the related art has difficulties in optimizing the manufacturing process when the photodiodes and the transistors are simultaneously manufactured.

In addition, in the CMOS image sensor according to the related art, if the size of a pixel increases, the resolution of the CMOS image sensor may decrease. Likewise, if the area for the photodiode decreases, the sensitivity of the image sensor may decrease.

BRIEF SUMMARY

Embodiments of the present invention are directed to an image sensor and a method for manufacturing the same.

An embodiment of the present invention provides an image sensor including a photodiode capable of raising quantum efficiency and a method for manufacturing the same.

According to an embodiment, an image sensor and a method for manufacturing the same are provided capable of improving resolution and sensitivity.

Embodiments of the present invention employ a vertically arranged photodiode. Further embodiments can inhibit certain defects from being formed in the photodiode.

An image sensor according to an embodiment can include circuitry on a substrate, a lower interconnection connecting to the circuitry on the substrate, carbon nanotubes on the lower interconnection, a conductive polymer layer on the carbon nanotubes, and a transparent conducting electrode on the carbon nanotubes.

A method for manufacturing an image sensor according to can embodiment can include forming circuitry on a substrate, forming a lower interconnection on the substrate connecting to the circuitry, forming carbon nanotubes on the lower interconnection, forming a conductive polymer layer on the carbon nanotubes; and forming a transparent conducting electrode on the carbon nanotubes.

DETAILED DESCRIPTION

Hereinafter, an image sensor and a method for manufacturing the same according to embodiments will be described with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Figure 1:
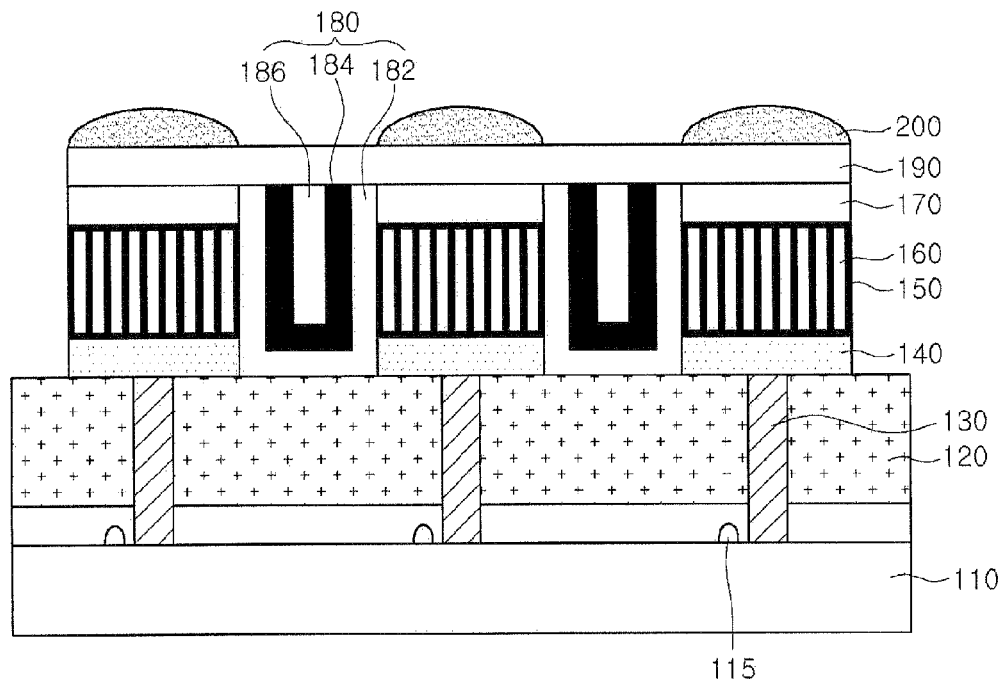
FIG. 1 is a cross-sectional view showing an image sensor according to an embodiment of the present invention.

Referring to FIG. 1, an image sensor can include a photodiode formed on a substrate 110. The photodiode can include a carbon nanotube 150 and a conductive polymer layer 160 formed on the carbon nanotubes 150. A transparent conducting electrode (TCE) 170 can be formed on the carbon nanotubes 150 and the conductive polymer layer 160. Although not shown in the figures, the substrate 110 is provided with circuitry 115 for each pixel. A lower interconnection 140 can connect the photodiode to the circuitry on the substrate 110 through, for example, an interconnection 130 formed on an interlayer dielectric layer 120 on the substrate 110.

According to an embodiment, the procedure of delivering electrons in the carbon nanotube 150 can be as follows. Specifically, electrons and holes can be generated in the conductive polymer layer 160 by external light. Then, the electrons can be quickly delivered to the lower interconnection 140 through the carbon nanotube 150 with ease.

The carbon nanotube 150 can have a metallic property or a semiconductor property depending on the structure thereof.

In addition, the carbon nanotube 150 can have a single-wall structure or a multi-wall structure. In this case, the single-wall structure refers to the carbon nanotube 150 being prepared in a single cylindrical structure, and the multi-wall structure refers to the carbon nanotube 150 having a multi-layer structure.

In a further embodiment, the image sensor can include an insulator 180 between pixels to inhibit cross-talk between pixels. In an embodiment, the insulator 180 can be provided between photodiodes. In a specific embodiment, the insulator 180 includes a first insulation part 182, a metal part 184, and a second insulation part 186.

In a further embodiment a color filter 190 and a microlens 200 can be formed on the photo diode.

Accordingly, the present invention can provide a vertical integration of the transistor circuitry and the photodiode.

According to embodiments of the present invention, the photodiode can be formed using a carbon nanotube. By using the carbon nanotubes, quantum efficiency can be raised.

In addition, a fill factor can near 100% due to the vertical integration of the transistor circuit and the photodiode.

According to embodiments of the subject image sensor, the sensitivity can be higher than that of the conventional technology for the same pixel size.

In addition, according to embodiments of the subject image sensor, the manufacturing cost can be reduced compared to that of the conventional technology when realizing the same resolution.

Because of the vertical integration of the circuitry and the photodiode, more complex circuits can be realized in each unit pixel without reducing sensitivity.

In addition, additional on-chip circuitry can be provided below the photodiode to increase the performance of the image sensor. Furthermore, the realization of a small-size element and the reduction of the manufacturing cost can be enabled.

Because a vertically integrated photodiode can be employed, the occurrence of defects in the photodiode can be reduced.

Hereinafter, a method for manufacturing the image sensor according to an embodiment will be described with reference to FIGS. 2A to 2F.

Figure 2A:
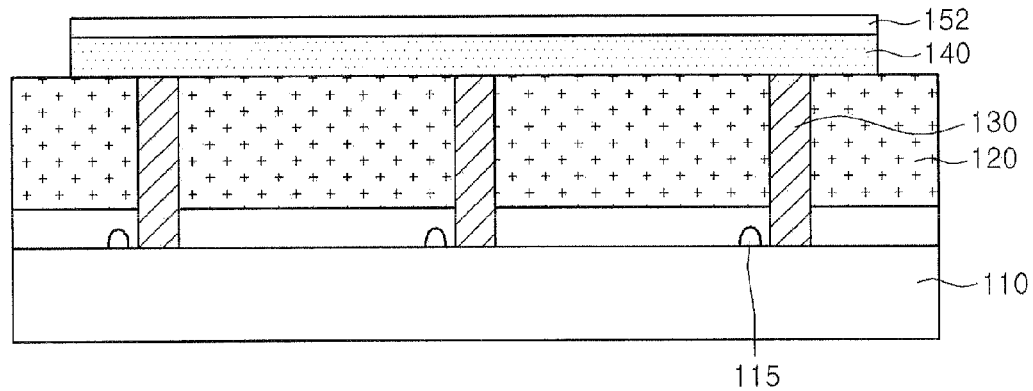
FIGS. 2A to 2F are cross-sectional views for describing a manufacturing method of an image sensor according to an embodiment of the present invention.

Referring to FIG. 2A, a substrate 110 can be provided having circuitry 115 formed thereon. An interlayer dielectric layer 120 and an interconnection 130 can be formed on the substrate 110.

A lower interconnection layer 140 can be formed on the interlayer dielectric layer 120 to be electrically connected with the interconnection 130.

Next, a catalyst layer 152 can be formed on the lower interconnection 140. In certain embodiments, the catalyst layer 152 can include Cobalt (Co), Iron (Fe), or Nickel (Ni) having a ferromagnetic property.

According to an embodiment, since the carbon nanotubes 150 can be deposited on the layer including Co, Fe, or Ni having the ferromagnetic property, the carbon nanotubes 150 can be selectively deposited using the catalyst layer 152.

Figure 2B:
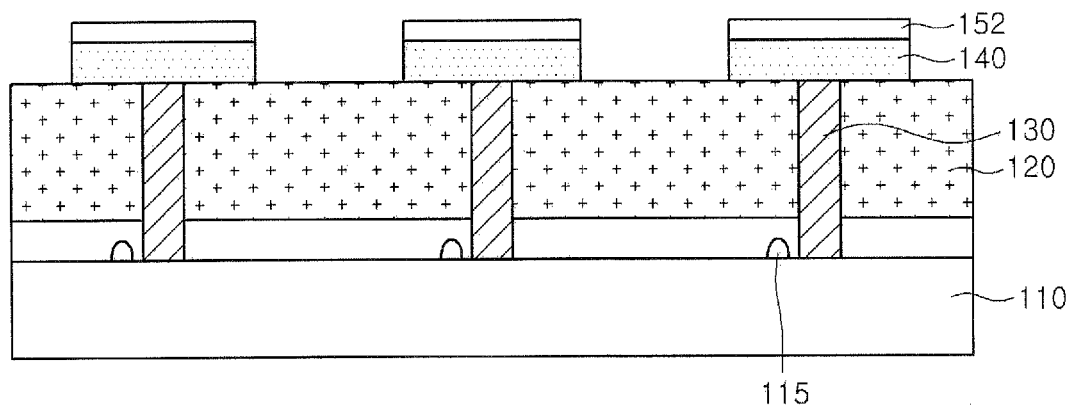

Accordingly, as shown in FIG. 2B, the catalyst layer 152 and the lower interconnection 140 can be selectively patterned through a photolithography process, providing regions upon which the carbon nanotubes 150 are to be deposited.

Figure 2C:
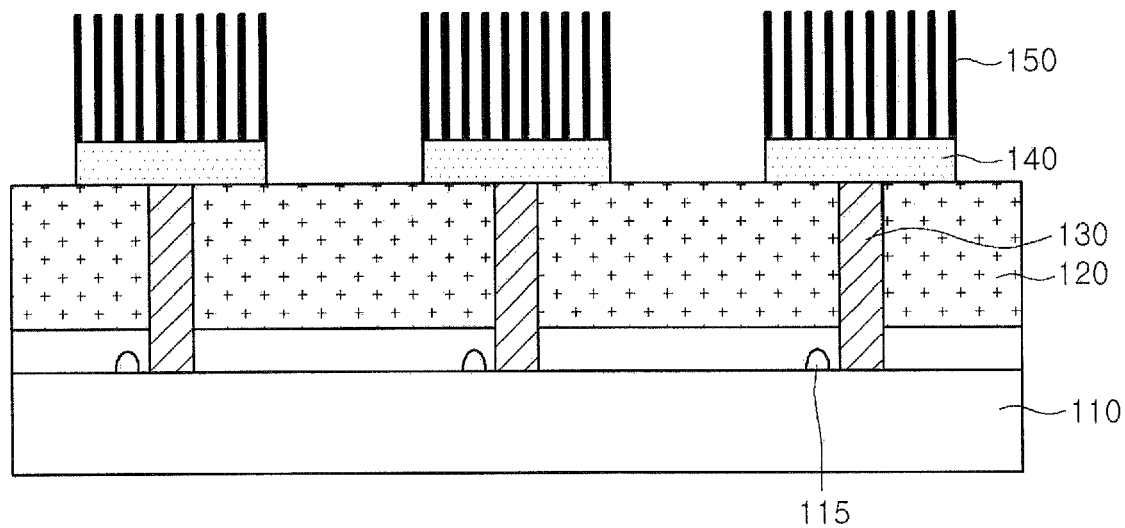

Referring to FIG. 2C, the carbon nanotubes 150 can then be selectively deposited on the remaining catalyst layer 152. For example, carbon nanotubes 150 can be vertically deposited with a thickness in the range of 10 Å to 100,000 Å on the catalyst layer 152.

According to an embodiment, before depositing the carbon nanotubes 150, the catalyst layer 152 can be activated through a plasma treatment. The activating plasma treatment can promote the selective deposition of the carbon nanotubes 150.

Figure 2D:
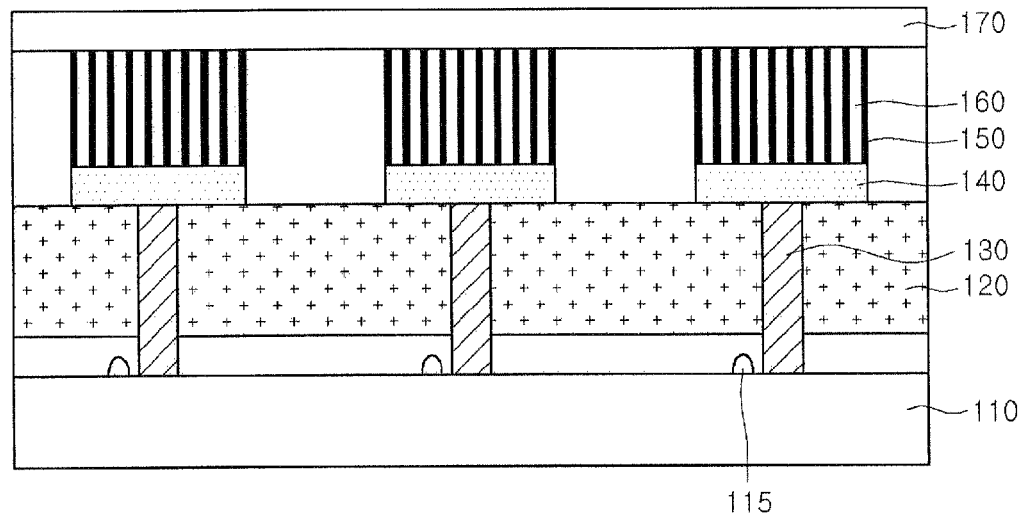

Referring to FIG. 2D, the carbon nanotubes 150 can be coated with a conductive polymer layer 160. The conductive polymer layer 160 can include conjugated polymer.

For example, the conductive polymer layer 160 can include, but is not limited to polythiophene, and its derivatives such as poly(3,4-ethylenedioxythiophene), and polyaniline, and its derivatives such as polypyrrole. Alternatively, the conductive polymer layer 160 can include a polymer having a conjugated structure. The polymer material can be coated on the substrate through a thermal-curing process or a UV curing process. In one embodiment, the conductive polymer layer 160 can be formed by coating a monomer of the above described conductive polymers in-situ.

Next, a transparent conducting electrode (TCE) 170 can be deposited on the carbon nanotubes 150.

Figure 2E:
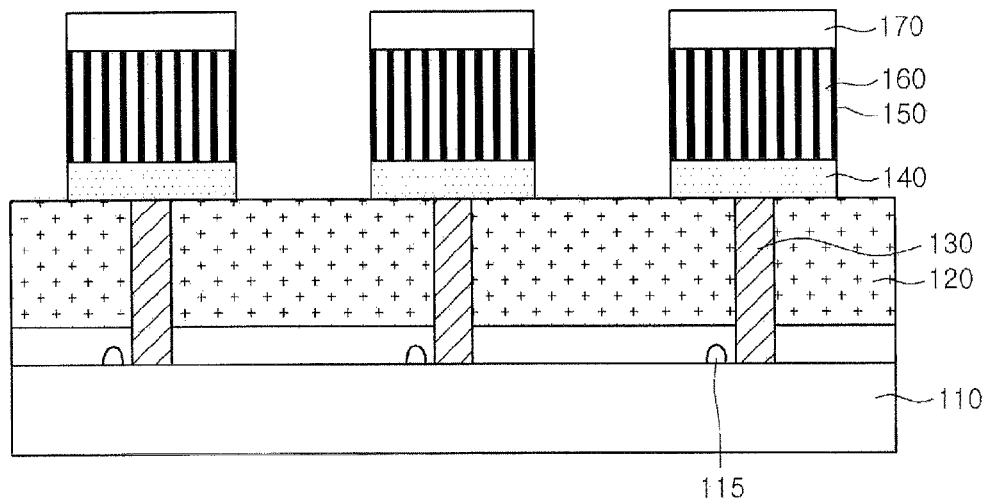

Referring to FIG. 2E, the resultant structure can be patterned through a photolithography and etch process to form a photodiode including the carbon nanotubes 150 separated by, for example, unit pixels.

Figure 2F:
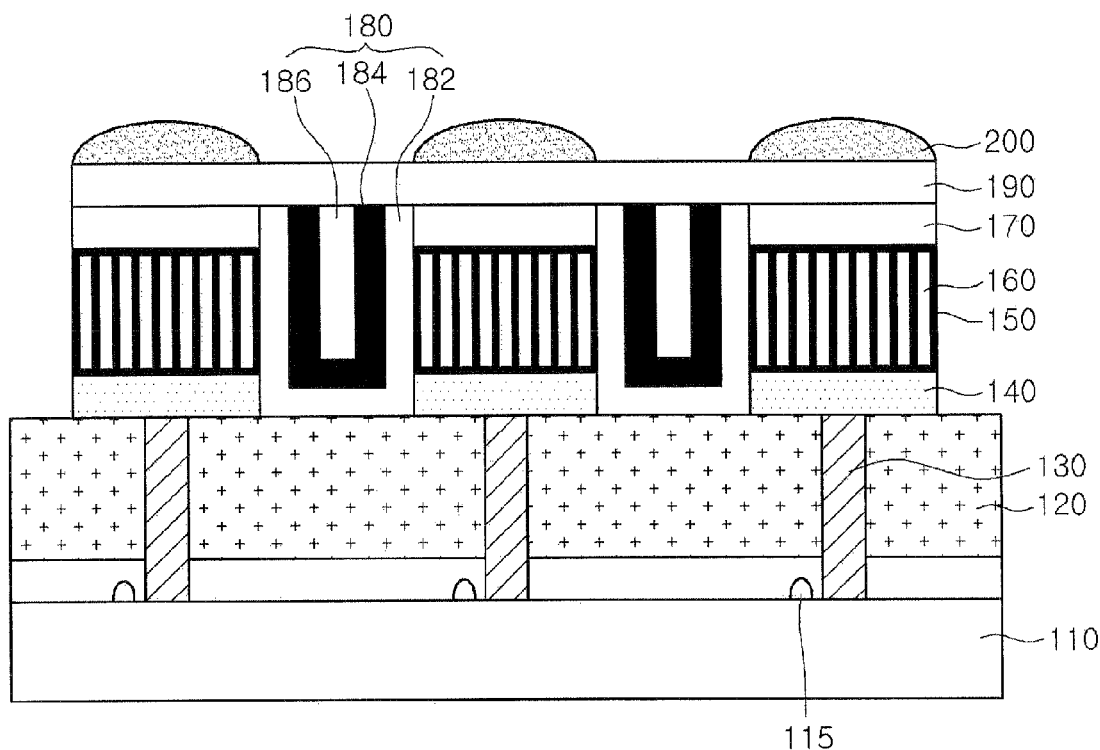

Referring to FIG. 2F, an insulator 180 can be provided to inhibit cross-talk between pixels. The insulator 180 can include a first insulation part 182, a metal part 184, and a second insulation part 186. The first insulation part 182 and the second insulation part 186 can be oxide layers.

In one embodiment, the insulator 180 can be formed by sequentially forming a first oxide layer, a metal layer, and a second oxide layer, and then performing an etch-back process such as a chemical mechanical polishing process.

In a further embodiment, a color filter 190 can be formed on the transparent conducting electrode 170.

In certain embodiments the color filter 190 can be formed by coating dyeable resist on the transparent conducting electrode 170, and performing an exposure and development process. The color filter 190 can be an RGB (red-green-blue) color filter, filtering light of each corresponding wavelength.

In a further embodiment, an insulating layer (not shown) can be additionally formed on the transparent conducting electrode 170, and then the color filter 190 is formed on the insulating layer.

In an embodiment utilizing the RGB color filter, a planarization layer (not shown) can be additionally formed on the color filter layer 190 in order to ensure flatness for the adjustment of a focal length and the formation of a lens layer.

In addition, a microlens 200 can be provided. In an embodiment, a photoresist layer (not shown) for a microlens can be coated on the color filter 190, and then selectively patterned through an exposure and development process to form a microlens photoresist pattern (not shown).

Thereafter, a reflow process can be performed with respect to the microlens photoresist pattern to form a microlens according to one embodiment of the present invention. The reflow process can be performed by positioning the substrate 110 having the microlens photoresist pattern on a hot plate, and then heating the substrate 110 at a temperature of 150° C. or more to form the microlens 200 having a semi-sphere shape.

Subsequently, a protective layer (not shown) can be formed on the microlens 200. In one embodiment, the protective layer can be a transparent oxide layer.

In the method for manufacturing an image sensor according to embodiments of the present invention, transistor circuitry and corresponding photodiode for each pixel can be vertically integrated. In addition, the photodiode can be formed using carbon nanotubes, so that quantum efficiency can be enhanced.

Figure 3:
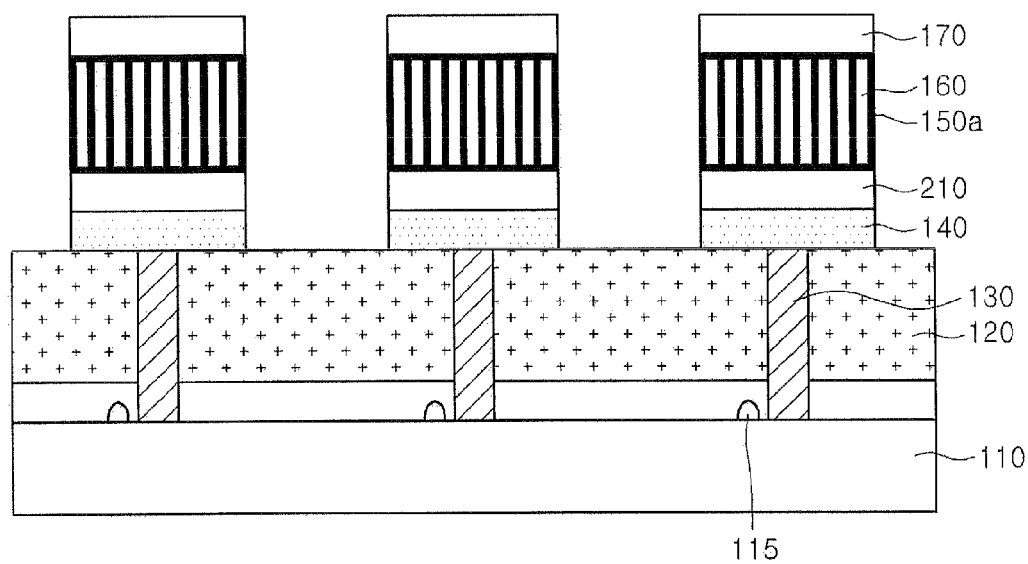
FIG. 3 is a cross-sectional view of an image sensor according to an embodiment of the present invention.

FIG. 3 is a cross-sectional view showing an image sensor according to a second embodiment.

The image sensor according to the second embodiment can employ the basic characteristics of the image sensor according to the embodiments described above.

However, in the image sensor according to the second embodiment, the carbon nanotubes 150a can be doped with a second conductive-type material. According to certain embodiments, a first conductive-type conductive layer 210 can be formed on the lower interconnection 140, and the second conductive-type carbon nanotubes 150a can be formed on the first conductive-type conductive layer 210.

In one embodiment, the first conductive-type conductive layer 210 can include n-doped amorphous silicon. However, embodiments are not limited thereto.

According to certain embodiments, the first conductive-type conductive layer 210 includes, but is not limited to a-Si:H, a-SiGe:H, a-SiC, a-SiN:H, or a-SiO:H obtained by adding germanium, carbon, nitrogen, or oxygen to amorphous silicon.

The first conductive-type conductive layer 210 can be formed through a chemical vapor deposition (CVD) process, such as a plasma enhanced chemical vapor deposition (PECVD) process. For example, the first conductive-type conductive layer 210 can be formed using amorphous silicon through the PECVD process by applying a mixture of silane gas ($SiH_4$) and $PH_3$ or $P_2H_5$.

In one embodiment, the carbon nanotubes 150a may be doped with P-type materials. However, embodiments are not limited thereto.

Figure 4:
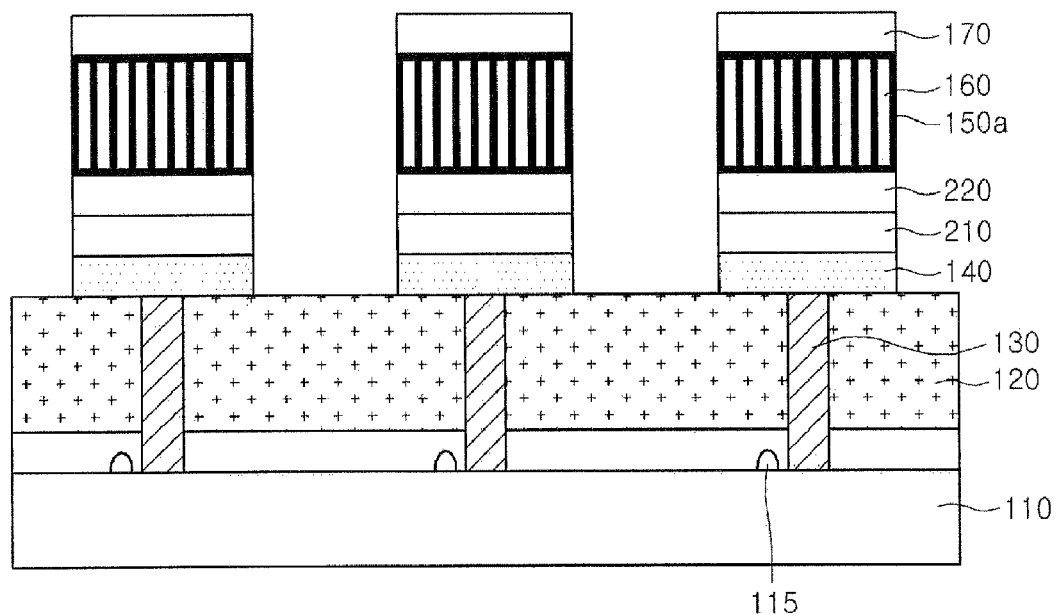
FIG. 4 is a cross-sectional view of an image sensor according to an embodiment of the present invention.

FIG. 4 is a cross-sectional view showing an image sensor according to a third embodiment.

The image sensor according to the third embodiment can employ the basic characteristics of the image sensors according to the above described embodiments.

However, the image sensor according to the third embodiment can further include an intrinsic layer 220 formed on the first conductive-type conductive layer 210. Second conductive-type carbon nanotubes 150a can be formed on the intrinsic layer 220.

In one embodiment, the intrinsic layer 220 can be formed by using amorphous silicon. The intrinsic layer 220 can be formed through CVD, such as PECVD. For example, the intrinsic layer 220 can be formed using amorphous silicon through the PECVD process by applying $SiH_4$.

Figure 5:
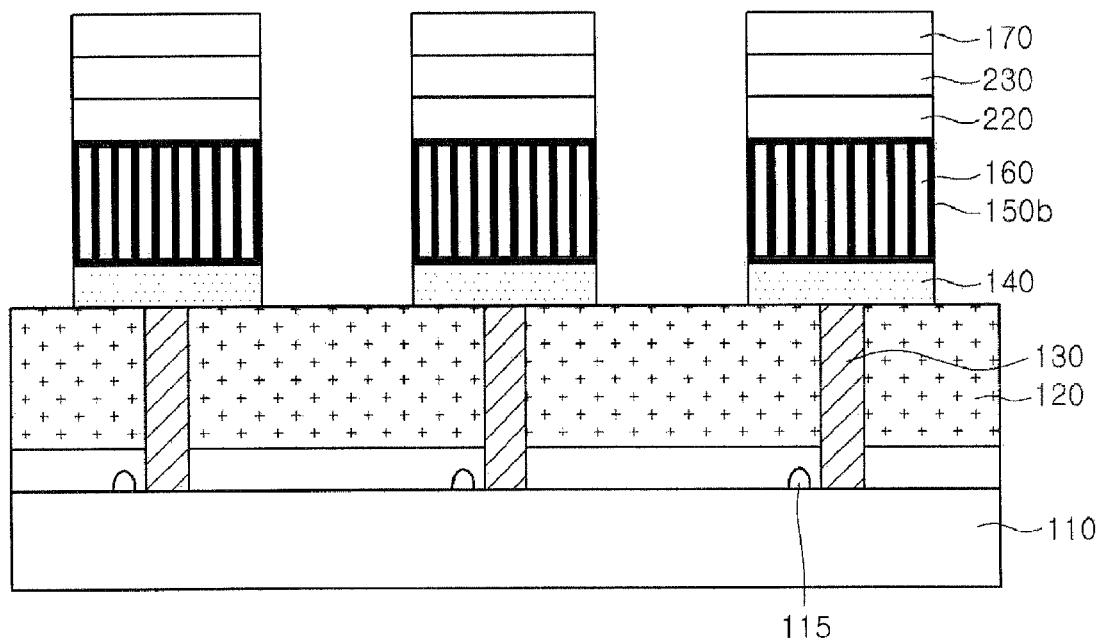
FIG. 5 is a cross-sectional view of an image sensor according to an embodiment of the present invention.

FIG. 5 is a cross-sectional view showing an image sensor according to a fourth embodiment.

The image sensor according to the fourth embodiment can employ basic characteristics of image sensors according to the above described embodiments.

However, the image sensor according to the fourth embodiment includes first conductive-type carbon nanotubes 150b. In an embodiment, a second conductive-type conductive layer 230 can be formed on the first conductive-type carbon nanotubes 150b. In a further embodiment, the image sensor can include an intrinsic layer 220 formed on the first conductive-type carbon nanotubes 150b, and the second conductive-type conductive layer 230 is formed on the intrinsic layer 220.

In one embodiment, the carbon nanotubes 150b can be doped with an N type material. However, embodiments are not limited thereto.

The second conductive-type conductive layer 230 can be formed subsequently to the process of forming the intrinsic layer 220. In one embodiment, the second conductive-type conductive layer 230 can be formed by using p-doped amorphous silicon. However, embodiments are not limited thereto.

According to an embodiment, the second conductive-type conductive layer 230 can be formed through a CVD process, such as a PECVD process. For example, the second conductive-type conductive layer 230 can be formed using amorphous silicon through the PECVD process by applying a mixture of the $SiH_4$ and boron (B).

Figure 6:
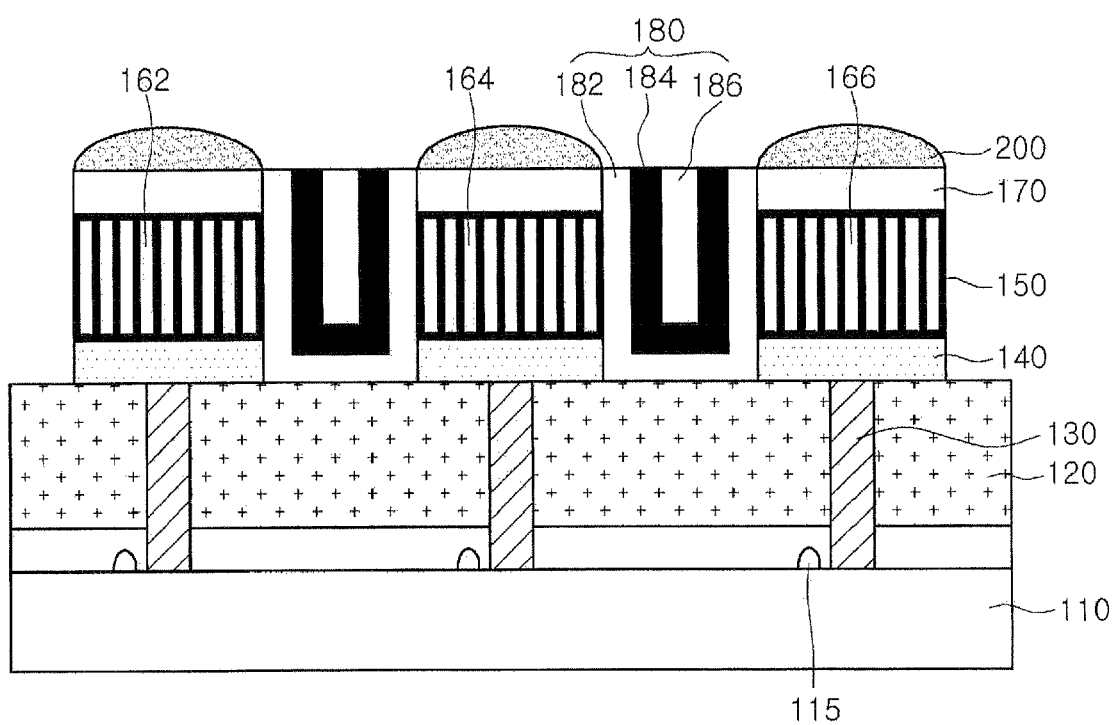
FIG. 6 is a cross-sectional view of an image sensor according to an embodiment of the present invention.

FIG. 6 is a cross-sectional view showing an image sensor according to an embodiment.

Referring to FIG. 6, the conductive polymer (160 of FIGS. 1, 3, 4, and 5) can comprise a first color conductive polymer 162, a second color conductive polymer 164, and a third color conductive polymer 166. In embodiments utilizing color polymers, a color filter (such as 190 of FIG. 1) can be omitted.

For example, according to an embodiment, the conductive polymer can be a red (R) conductive polymer 162, a green (G) conductive polymer 164, and a blue (B) conductive polymer 166.

Accordingly, because a conductive polymer using color polymer can be employed, color filtering can be performed without an additional color filter.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
a substrate including transistor circuitry;
a lower interconnection on the substrate connected to the transistor circuitry
a first conductive-type conductive layer on the lower interconnection;
an intrinsic layer on the first conductive-type conductive layer;
carbon nanotubes on the intrinsic layer; and
a conductive polymer layer coated on the carbon nanotubes,
wherein the carbon nanotubes are doped with a second conductive-type material.

2. The image sensor according to claim 1, wherein the conductive polymer layer comprises a color polymer.

3. The image sensor according to claim 1, further comprising a transparent conducting electrode on the carbon nanotubes.

4. An image sensor comprising:
a substrate including transistor circuitry;
a lower interconnection on the substrate connected to the transistor circuitry;
carbon nanotubes on the lower interconnection;
an intrinsic layer on the carbon nanotubes;
a second conductive-type conductive layer on the intrinsic layer; and
a conductive polymer layer on the second conductive-type conductive layer,
wherein the carbon nanotubes are doped with a first conductive-type material.

5. The image sensor according to claim 4, wherein the conductive polymer layer comprises a color polymer.

6. The image sensor according to claim 4, further comprising a transparent conducting electrode on the carbon nanotubes.

7. An image sensor comprising:
a substrate including transistor circuitry;
a lower interconnection on the substrate connected to the transistor circuitry;

carbon nanotubes on the lower interconnection;

a conductive polymer layer coated on the carbon nanotubes; and a silicon-based conductive layer contacting the conductive polymer coated carbon nanotubes.

8. The image sensor according to claim 7, wherein the carbon nanotubes are doped with a second conductive-type material.

9. The image sensor according to claim 8, wherein the Si-based conductive layer contacting the conductive polymer coated carbon nanotubes is of a first conductive-type and is disposed below the carbon nanotubes.

10. The image sensor according to claim 7, wherein the carbon nanotubes are doped with a first conductive-type material.

11. The image sensor according to claim 10, wherein the Si-based conductive layer contacting the conductive polymer coated carbon nanotubes is of a second conductive-type and is disposed on the carbon nanotubes.

12. The image sensor according to claim 7, wherein the conductive polymer layer comprises a color polymer.

13. The image sensor according to claim 7, further comprising a transparent conducting electrode on the carbon nanotubes.

* * * * *